United States Patent
Shimizu et al.

(10) Patent No.: US 9,526,182 B2
(45) Date of Patent: Dec. 20, 2016

(54) COMPONENT-EMBEDDED SUBSTRATE MANUFACTURING METHOD

(75) Inventors: Ryoichi Shimizu, Ayase (JP); Tohru Matsumoto, Ayase (JP); Takuya Hasegawa, Ayase (JP); Yoshio Imamura, Ayase (JP)

(73) Assignee: MEIKO ELECTRONICS CO., LTD., Ayase-shi, Kanagawa (JP)

( * ) Notice: Subject to any disclaimer, the term of this patent is extended or adjusted under 35 U.S.C. 154(b) by 242 days.

(21) Appl. No.: 14/355,192

(22) PCT Filed: Oct. 31, 2011

(86) PCT No.: PCT/JP2011/075059
§ 371 (c)(1),
(2), (4) Date: Apr. 29, 2014

(87) PCT Pub. No.: WO2013/065099
PCT Pub. Date: May 10, 2013

(65) Prior Publication Data
US 2014/0347835 A1    Nov. 27, 2014

(51) Int. Cl.
*H05K 3/30* (2006.01)
*H05K 3/40* (2006.01)
(Continued)

(52) U.S. Cl.
CPC ......... *H05K 3/4038* (2013.01); *H01L 21/6835* (2013.01); *H01L 23/544* (2013.01);
(Continued)

(58) Field of Classification Search
CPC .... H05K 1/0269; H05K 1/0266; H05K 1/115; H05K 1/188; H05K 3/303; H05K 3/4038; H05K 23/544; H05K 24/19; H05K 21/6835; H05K 24/82; H05K 24/83; H05K 3/46; H05K 3/4652; H05K 2201/09063; H05K 2201/09918; H05K 2203/063; H05K 2203/1469; H05K 2203/0703; H05K 3/421; H05K 2203/1461; H01L 2224/82132; H01L 2224/83005; H01L 2224/83132; H01L 21/568; H01L 24/37; H01L 24/29; H01L 24/32; H01L 24/92; H01L 2221/68359; H01L 2223/54426; H01L 2223/54486; H01L 2224/04105; H01L 2224/2741; H01L 2224/27436; H01L 2224/2919; H01L 2224/2929; H01L 2224/29387; H01L 2224/32245; H01L 2224/82039; H01L 2224/8314; H01L 2224/83192; H01L 2224/92144; H01L 2924/14; Y02P 70/613
(Continued)

(56) References Cited

U.S. PATENT DOCUMENTS 5,956,564 A * 9/1999 Newman ................. G03F 9/708
                                                          29/603.1
7,719,851 B2 * 5/2010 Tuominen ........... H01L 23/5389
                                                          29/842
(Continued)

FOREIGN PATENT DOCUMENTS

JP    2007-123797 A    5/2007
JP    2008-522396 A    6/2008
(Continued)

OTHER PUBLICATIONS

Extended European Search Report from Application No. EP 11874961 dated Apr. 20, 2015.
(Continued)

*Primary Examiner* — Donghai D Nguyen
(74) *Attorney, Agent, or Firm* — Marshall, Gerstein & Borun LLP

(57) ABSTRACT

The method includes positioning an electronic component using main marks formed on a metal layer and mounting the electronic component on a second surface of the metal layer with an adhesive layer interposed between the metal layer and both of the electronic component and terminals; then
(Continued)

burying the electronic component and the main marks in an insulating substrate; then removing part of the metal layer and forming a first window for exposing the main marks therefrom and a second window for exposing the adhesive layer including a position corresponding to the terminal therefrom; then using the exposed main marks as references and forming a laser via hole LVH reaching the terminal in the adhesive layer exposed from the second window; and thereby forming a wiring pattern from the metal layer electrically connected to the terminal through a first conductive via formed by plating the LVH with copper.

13 Claims, 13 Drawing Sheets

(51) Int. Cl.
| | | |
|---|---|---|
| *H05K 1/02* | (2006.01) | |
| *H05K 1/11* | (2006.01) | |
| *H05K 1/18* | (2006.01) | |
| *H01L 23/544* | (2006.01) | |
| *H01L 23/00* | (2006.01) | |
| *H01L 21/683* | (2006.01) | |
| *H05K 3/46* | (2006.01) | |
| *H05K 3/42* | (2006.01) | |
| *H01L 21/56* | (2006.01) | |

(52) U.S. Cl.
CPC ............. *H01L 24/19* (2013.01); *H01L 24/82* (2013.01); *H01L 24/83* (2013.01); *H05K 1/0266* (2013.01); *H05K 1/0269* (2013.01); *H05K 1/118* (2013.01); *H05K 1/188* (2013.01); *H05K 3/303* (2013.01); *H01L 21/568* (2013.01); *H01L 24/27* (2013.01); *H01L 24/29* (2013.01); *H01L 24/32* (2013.01); *H01L 24/92* (2013.01); *H01L 2221/68359* (2013.01); *H01L 2223/54426* (2013.01); *H01L 2223/54486* (2013.01); *H01L 2224/04105* (2013.01); *H01L 2224/2741* (2013.01); *H01L 2224/27436* (2013.01); *H01L 2224/2919* (2013.01); *H01L 2224/2929* (2013.01); *H01L 2224/29387* (2013.01); *H01L 2224/32245* (2013.01); *H01L 2224/82039* (2013.01); *H01L 2224/82132* (2013.01); *H01L 2224/83005* (2013.01); *H01L 2224/8314* (2013.01); *H01L 2224/83132* (2013.01); *H01L 2224/83192* (2013.01); *H01L 2224/92144* (2013.01); *H01L 2924/14* (2013.01); *H05K 3/421* (2013.01); *H05K 3/4602* (2013.01); *H05K 3/4623* (2013.01); *H05K 3/4652* (2013.01); *H05K 2201/09063* (2013.01); *H05K 2201/09918* (2013.01); *H05K 2203/063* (2013.01); *H05K 2203/0703* (2013.01); *H05K 2203/1461* (2013.01); *Y02P 70/613* (2015.11); *Y10T 29/49165* (2015.01)

(58) Field of Classification Search
USPC ............... 29/603.1, 830–832, 834, 846, 852; 174/259, 262; 361/761, 767; 438/975
See application file for complete search history.

(56) References Cited

U.S. PATENT DOCUMENTS

| | | |
|---|---|---|
| 2005/0111206 A1 | 5/2005 | Borland et al. |
| 2007/0069363 A1 | 3/2007 | Kawabata et al. |
| 2007/0227761 A1 | 10/2007 | Tuominen et al. |
| 2008/0211086 A1* | 9/2008 | Morita ............... H01L 23/5389 257/702 |
| 2009/0199399 A1 | 8/2009 | Kariya et al. |
| 2009/0205202 A1 | 8/2009 | Tanaka et al. |
| 2009/0293271 A1 | 12/2009 | Tanaka |
| 2011/0048777 A1 | 3/2011 | Chang et al. |
| 2011/0061909 A1 | 3/2011 | Palm et al. |

FOREIGN PATENT DOCUMENTS

| | | |
|---|---|---|
| JP | 2009-194382 A | 8/2009 |
| JP | 2010-027917 A | 2/2010 |
| JP | 2011-523773 A | 8/2011 |

OTHER PUBLICATIONS

International Search Report for JP/2011/075059, mailed Nov. 29, 2011.
Written Opinion for PCT/JP2011/075059, mailed Nov. 29, 2011.

* cited by examiner

COMPONENT-EMBEDDED SUBSTRATE MANUFACTURING METHOD

TECHNICAL FIELD

The present invention relates to a component-embedded substrate manufacturing method for embedding electrical or electronic components in a substrate and a component-embedded substrate manufactured using the same.

BACKGROUND ART

Recently, with an increased density and enhanced function of an electronic circuit board, attention has been paid to a component-embedded substrate having a structure in which electronic components are embedded in an insulating substrate serving as an insulating layer. With a wiring pattern formed on a surface of the insulating substrate, the component-embedded substrate can be used as a module board on the surface of which various electronic components are mounted in a predetermined position of the wiring pattern and can also be used as a core board for use in manufacturing a component-embedded multilayer circuit board by a buildup method.

The aforementioned component-embedded substrate requires an electrical connection between the wiring pattern and the terminals of the electronic components in the insulating substrate. It has been known to use soldering for the connection (for example, see Patent Document 1).

In the meantime, several surface mounting processes of various electronic components are performed in the process of manufacturing the module board or the multilayer circuit board. In general, reflow soldering is performed for the surface mounting of the electronic components. Each time an electronic component is mounted, the component-embedded substrate is placed in a reflow furnace and is heated to a temperature at which the solder melts. Therefore, the connection portion between the wiring pattern and the terminals of the intra-substrate electronic components in the component-embedded substrate disclosed in Patent Document 1 is heated to a solder melting temperature several times, which may reduce the reliability of the connection portion.

In light of this, in order to improve the reliability of the connection portion in the component-embedded substrate, it has been known to provide electrical connections between the terminals of the intra-substrate electronic components and the wiring pattern on the surface of the substrate by copper plating. Specifically, the melting point of copper is higher than the melting point of the solder, and thus the component-embedded substrate placed in the reflow furnace does not allow the connection portion to melt, thereby maintaining the reliability of the connection portion.

For example, as an aspect of the method of manufacturing a component-embedded substrate by electrically connecting the terminals of the intra-substrate electronic components to the wiring pattern on the surface of the insulating substrate using such a copper plating method, there has been known a component-embedded substrate manufacturing method disclosed in Patent Document 2.

Here, the following description focuses on the component-embedded substrate manufacturing method as exemplified by Patent Document 2.

First, a lamellar body is formed by laminating an insulating layer on a metal layer such as a copper foil, and a guide hole is provided in the lamellar body. Then, a connection hole is provided in a component arrangement region in which an intra-substrate component is expected to be arranged in the lamellar body using the guide hole as a reference. In a later step, the connection hole is to be filled with copper to form a metal joint for electrically connecting the wiring pattern to the terminal of the intra-substrate component. Therefore, the connection holes are provided for the number of the terminals corresponding to the places in which the terminals of the intra-substrate components are expected to be positioned. Then, an adhesive is applied to the component arrangement region and the adhesive is used to fix the intra-substrate components. At this time, the intra-substrate components are positioned using the connection holes. Then, the lamellar body having the intra-substrate components placed therein is laminated with an insulating base material such as a prepreg to form an insulating substrate having the intra-substrate components embedded therein. The obtained insulating substrate has the metal layer located on one surface thereof and the connection hole is opened in a predetermined position of the metal layer. In this state of the insulating substrate, the adhesive is removed from within the connection holes to expose the terminal of the intra-substrate component in the connection hole, and then the entire insulating substrate is subjected to a copper plating process. This causes copper to grow and fill the connection hole so as to electrically connect the metal layer on the surface of the insulating substrate to the terminal of the intra-substrate component. Subsequently, part of the metal layer on the surface of the insulating substrate is etched to form a wiring pattern and thereby to form a component-embedded substrate.

PRIOR-ART DOCUMENT

Patent Documents

Patent Document 1: Japanese Patent Laid-Open No. 2010-027917

Patent Document 2: National Publication of International Patent Application No. 2008-522396

SUMMARY OF THE INVENTION

Problem to be Solved by the Invention

Unfortunately, the aforementioned manufacturing method has a problem of a relatively low accuracy of positioning the intra-substrate components and the connection holes because various holes are referenced to position the intra-substrate components and the connection holes.

In addition, when the adhesive for fixing the intra-substrate component is applied to the component arrangement region, part of the adhesive flows into the connection hole. This disadvantageously reduces thickness of the adhesive layer, which may cause the following troubles.

First, a commonly used adhesive for fixing the intra-substrate components contains a filler to maintain the strength of the adhesive layer after the adhesive is cured. However, an adhesive layer with a thickness less than the size of the filler may cause the filler to easily fall off from the adhesive layer and hence a required strength may not be obtained.

Note that the adhesive layer is also used as the insulating layer. Thus, when the adhesive layer is too thin, it may be difficult to ensure the required insulating properties.

Therefore, a low viscosity adhesive that tends to flow into the connection hole is not suitable for the aforementioned manufacturing method and hence the available adhesive is limited.

It is an object of the invention, which has been made in view of the above circumstances, is to provide a component-embedded substrate manufacturing method capable of positioning the embedded components with a good accuracy and widening the range of choice of the adhesive for fixing the components; and a component-embedded substrate manufactured using the same.

Means for Solving the Problem

In order to attain the above object, the present invention provides a method of manufacturing a component-embedded substrate where in an insulating substrate having a wiring pattern on a surface thereof, an electrical or electronic component having a terminal electrically connected to the wiring pattern is embedded, the method comprising: a mark forming step of forming a metal layer to serve as the wiring pattern on a support plate and forming a main mark made of a metal columnar body on a second surface opposite to a first surface contacting the support plate of the metal layer; a component mounting step of positioning the component using the main mark as a reference relative to the metal layer and mounting the component on the second surface of the metal layer with an insulating adhesive layer interposed between the component and the terminal; a buried layer forming step of forming a buried layer serving as the insulating substrate having the component and the main mark buried on the second surface of the metal layer having the component mounted thereon; a window forming step of separating the support plate from the metal layer, then removing part of the metal layer from the first surface side of the metal layer exposed by the separation, and thereby forming a first window for exposing the main mark and at least a part of the buried layer; a via hole forming step of determining a position of a terminal of the component using the main mark exposed from the first window as a reference and forming a first via hole reaching the terminal; a conductive via forming step of subjecting the first via hole to a plating process, then filling metal thereinto, and thereby forming a first conductive via; and a pattern forming step of forming the wiring pattern from the metal layer electrically connected to the terminal through the conductive via.

Here, a preferred aspect of the component-embedded substrate manufacturing method is that in the mark forming step, a sub mark made of a metal columnar body is formed on the second surface of the metal layer simultaneously together with the main mark; before the window forming step, the method further comprises a through-hole forming step of determining the sub mark using X-rays and thereby forming a through-hole penetrating all of the metal layer, the sub mark, and the buried layer, wherein in the window forming step, the first window is formed using the through-hole as a reference.

In addition, in a preferred aspect, in the window forming step, a second window for exposing a portion of the adhesive layer including a position corresponding to the terminal of the component is further formed; and in the via hole forming step, the first via hole reaching the terminal in the adhesive layer exposed from the second window is formed.

In addition, in a preferred aspect, in the mark forming step, a sub mark made of a metal columnar body is formed on the second surface of the metal layer simultaneously together with the main mark; before the window forming step, the method further comprises a through-hole forming step of determining the sub mark using X-rays and thereby forming a through-hole penetrating all of the metal layer, the sub mark, and the buried layer, wherein in the window forming step, the first window and the second window are formed using the through-hole as a reference.

In addition, in a preferred aspect, in the mark forming step, a pedestal made of a metal columnar body is formed simultaneously together with the main mark at a position within a mounting expected region of the component on the second surface of the metal layer and at a position excluding a portion in which the terminal is expected to be positioned; and in the component mounting step, the component on the pedestal is placed and the adhesive layer is interposed between the second surface and both of the component and the terminal.

In addition, preferably, before the buried layer forming step, the method further comprises a circuit board preparation step of preparing an inner circuit board to be further buried within the buried layer, the inner circuit board including an inner insulating plate, an inner conductive circuit provided on both surfaces of the inner insulating plate, and an alignment mark provided at a predetermined position on the inner insulating plate, wherein in the buried layer forming step, the buried layer is formed in a state in which the alignment mark and the main mark are aligned in a thickness direction of the component-embedded substrate and a predetermined space is secured between the inner circuit board and the second surface of the metal layer; in the via hole forming step, a position of the inner conductive circuit is determined using the main mark exposed from the first window as a reference and a second via hole reaching the inner conductive circuit is further formed; and in the conductive via forming step, the second via hole is plated with metal and a second conductive via is further formed.

In addition, preferably, in the conductive via forming step, the second conductive via is a filled via obtained by subjecting the second via hole to via filling plating and filling metal therein.

In addition, preferably, in the conductive via forming step, the second conductive via is formed to have a diameter equal to or greater than that of the first conductive via.

In addition, preferably, the columnar body is formed by pattern plating using a plating resist film.

In addition, preferably, the adhesive layer is made of an epoxy-based resin or a polyimide-based resin.

In addition, preferably, in the component mounting step, the component is mounted in a state in which the terminal of the component is oriented toward the second surface side.

In addition, preferably, an aluminum plate is used as the support plate; and a copper foil attached to the aluminum plate is used as the metal layer.

In addition, preferably, a stainless plate is used as the support plate; and a copper plating film deposited on the stainless plate is used as the metal layer.

In addition, the present invention provides a component-embedded substrate manufactured using the above described component-embedded substrate manufacturing method.

Here, preferably, the component-embedded substrate further comprises the sub mark formed simultaneously together with the main mark; more preferably, the component-embedded substrate further comprises the pedestal formed simultaneously together with the main mark; and further more preferably, the component-embedded substrate further comprises the inner circuit board.

Effects of the Invention

The component-embedded substrate manufacturing method according to the present invention uses the main mark formed in the metal layer to position the electrical or electronic component; and the via hole forming step in a later step also uses the same main mark to form the via hole. In other words, when the component is positioned and when the position of the terminal of the component is determined after the component is buried in the buried layer, the same mark is used as a reference and hence the accuracy of positioning between the component and the wiring pattern is extremely high.

In addition, the component-embedded substrate manufacturing method according to the present invention mounts the component on the metal layer with the adhesive layer interposed therebetween, then subjects the cured adhesive layer to a drilling process, and thereby forms the via hole, which prevents the adhesive from falling down thereinto. This enables the adhesive layer to have a required thickness and can ensure the adhesive strength and the insulating properties as originally designed. In other words, the present invention widens the range of choice of the adhesive.

Further, according to the present invention, in the mark forming step, the sub mark is formed together with the main mark, then the sub mark is determined using X-ray before the window forming step, thereby forming a through-hole penetrating all of the metal layer, the sub mark, and the buried layer. The use of the through-hole as a reference allows an easy determination of the position of the main mark hidden in the metal layer and the position corresponding to the terminal of the component, and hence allows an easy formation of the first window and the second window.

In addition, according to the present invention, in an aspect comprising the pedestal, the pedestal serves as a spacer for ensuring a space between the component and the metal layer (wiring pattern), and hence can maintain a constant thickness of the adhesive layer between the component and the metal layer. As a result, an adhesive layer having excellent adhesive strength and insulating properties can be stably obtained.

In addition, according to the present invention, the main mark, the sub mark, and the pedestal each made of a metal columnar body are formed by pattern plating using a plating resist film and hence can be easily formed without newly adding a manufacturing facility. Therefore, the present invention contributes to improving production efficiency of the entire component-embedded substrate.

In addition, the component-embedded substrate of the present invention is obtained by the above described manufacturing method and hence has an extremely high accuracy of positioning between the embedded component and the wiring pattern and a low rate of occurrence of defective products.

DESCRIPTION OF EMBODIMENTS (First Embodiment)

According to the present invention, first, a positioning mark made of a copper columnar body is formed on a starting material (mark forming step). Here, the starting material is prepared, for example, as follows.

Figure 1:
FIG. 1 is a cross-sectional view schematically illustrating a support plate for use in a component-embedded substrate manufacturing method according to a first embodiment of the present invention.
Figure 2:
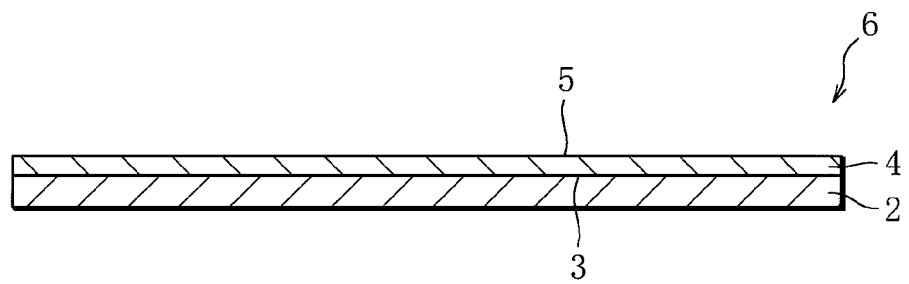
FIG. 2 is a cross-sectional view schematically illustrating a state in which a metal layer is formed on the support plate of FIG. 1.

First, as illustrated in FIG. 1, a support plate 2 is prepared. The support plate 2 is, for example, a thin plate made of stainless steel. Then, as illustrated in FIG. 2, a first metal layer 4 made of a thin film is formed on the support plate 2. The first metal layer 4 is made of, for example, a copper plating film obtained by electroplating. Thus obtained copper-clad steel plate 6 is assumed to be the starting material. Here, a surface of the first metal layer 4 contacting the support plate 2 is assumed to be a first surface 3; and a surface opposite to the first surface 3 is assumed to be a second surface 5.

Note that an aluminum thin plate may be used as the support plate 2. In this case, the first metal layer 4 is made of a copper foil and attached to a surface of the aluminum thin plate.

Figure 3:
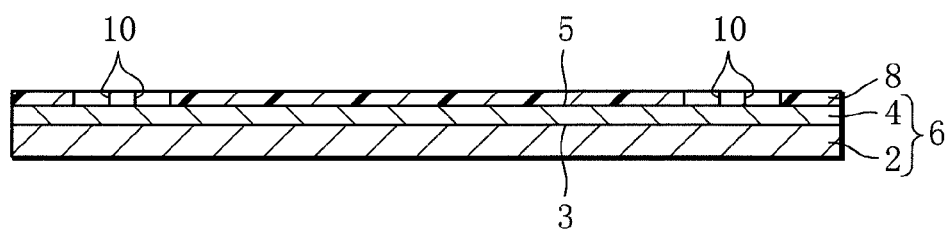
FIG. 3 is a cross-sectional view schematically illustrating a state in which a plating resist film for pattern plating is formed on the metal layer of FIG. 2.
Figure 4:
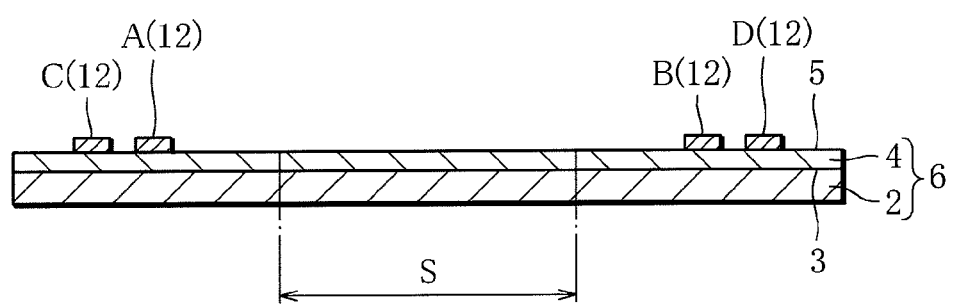
FIG. 4 is a cross-sectional view schematically illustrating a state in which marks are formed on the metal layer of FIG. 2.

Next, as illustrated in FIG. 3, a mask layer 8 is formed on the first metal layer 4 of the prepared copper-clad steel plate 6. The mask layer 8 is, for example, a plating resist made of a dry film having a predetermined thickness. An opening 10 is provided at a predetermined position and the first metal layer 4 is exposed from the opening 10. Then, the copper-clad steel plate 6 having such a mask layer 8 is subjected to copper electroplating thereby to preferentially deposit copper in the exposed portion and to form a columnar copper post having a height equal to the thickness of the dry film. Subsequently, the mask layer (e.g., the dry film) 8 is removed thereby to form a positioning mark 12 made of a copper post in a predetermined position on the second surface 5 of the first metal layer 4 (FIG. 4).

The position of arranging the mark 12 can be arbitrarily selected, but preferably is a position that can be easily recognized by an optical sensor of an optical positioning apparatus (unillustrated) for positioning an electronic component to be embedded in an insulating substrate (hereinafter referred to as an intra-substrate component) 14. According to the present embodiment, as illustrated in FIG. 4, marks 12 are formed, two for each, in both end portions of the copper-clad steel plate 6 so as to sandwich a mounting expected region S on which the intra-substrate component 14 is expected to be mounted. Here, of the marks in FIG. 4, the marks located near the mounting expected region S are referred to as inside marks (main marks) A and B, and the marks located opposite to the mounting expected region S with the inside marks A and B therebetween are referred to as outside marks (sub marks) C and D.

Next, the intra-substrate component 14 is mounted on the copper-clad steel plate 6 with the adhesive 16 therebetween (component mounting step).

Figure 5:
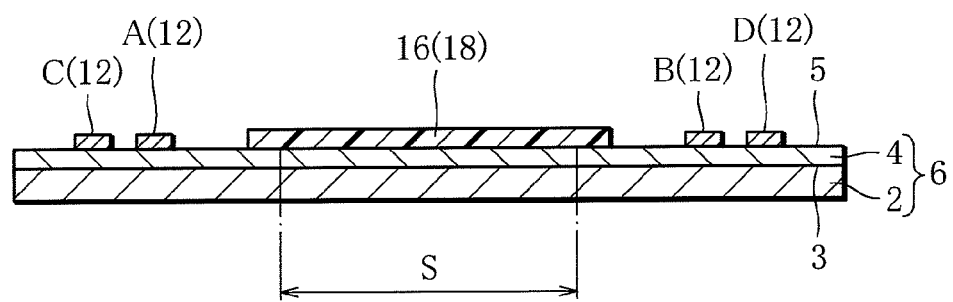
FIG. 5 is a cross-sectional view schematically illustrating a state in which an adhesive is supplied onto the metal layer of FIG. 4.

First, as illustrated in FIG. 5, the adhesive 16 is supplied to the mounting expected region S. The adhesive 16 may cover the entire mounting expected region S, and the accuracy of positioning the adhesive 16 may be relatively low. Note that it is preferable that when the adhesive 16 is positioned, the mounting expected region S is determined using the inside marks A and B as the references and the adhesive 16 is applied to the determined position, which increases the accuracy of positioning the adhesive 16.

The above described adhesive 16 is cured to be an adhesive layer 18 with a predetermined thickness. The obtained adhesive layer 18 fixes the intra-substrate component 14 in a predetermined position and has predetermined insulating properties. The adhesive 16 is not particularly limited as long as the adhesive exhibits a predetermined adhesive strength and predetermined insulating properties after it is cured, but for example, an adhesive having a filler added to a thermosetting epoxy-based resin or a polyimide-based resin is used. Examples of the filler include a fine powder such as silica (silicon dioxide) and a glass fiber.

According to the present invention, the embodiment of the adhesive 16 to be supplied to the mounting expected region S is not particularly limited, and may be an embodiment of applying a liquid-state adhesive 16 with a predetermined thickness or an embodiment of placing a sheet-like adhesive 16 with a predetermined thickness. The present embodiment uses a liquid-state adhesive in which a fine powder of silica is added to a thermosetting epoxy-based resin.

Figure 6:
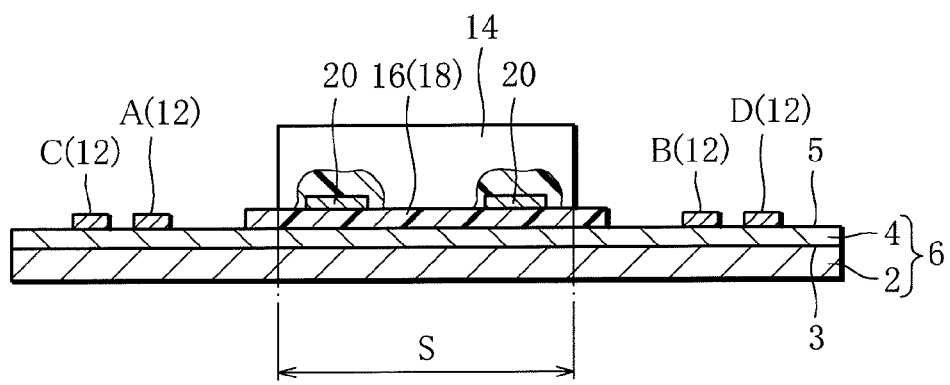
FIG. 6 is a cross-sectional view schematically illustrating a state in which an electronic component is mounted on the adhesive of FIG. 5.

Next, as illustrated in FIG. 6, the adhesive 16 is applied to the mounting expected region S on the second surface 5 of the first metal layer 4 and the intra-substrate component 14 is mounted thereon. At this time, the intra-substrate component 14 is positioned in the mounting expected region S using the inside marks A and B as the references. Subsequently, the adhesive 16 is heated in a reflow furnace or a thermosetting furnace and then cured to be the adhesive layer 18. Thereby, the intra-substrate component 14 is fixed to a predetermined position.

More particularly, as is clear from FIG. 6, the intra-substrate component 14 is a rectangular packaging component in which IC chips and the like (unillustrated) are covered with resin and a plurality of terminals 20 are provided in a lower portion of the packaging component. In addition, the adhesive layer 18 is interposed between the second surface 5 of the first metal layer 4 and each of the intra-substrate component 14 and the terminals 20.

Next, an insulating base material is laminated to bury the intra-substrate component 14, the inside marks A and B, and the outside marks C and D (buried layer forming step).

Figure 7:
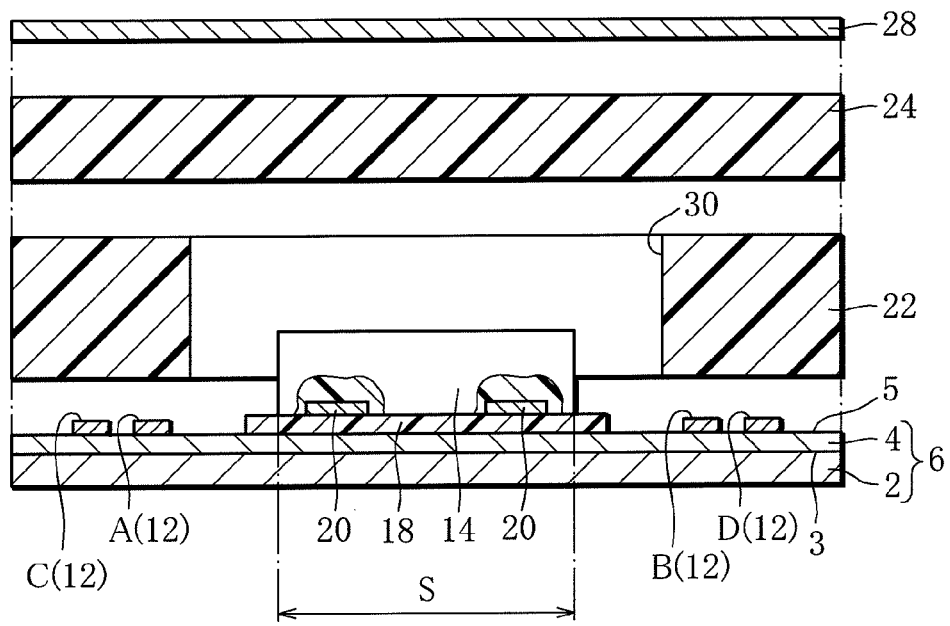
FIG. 7 is a cross-sectional view schematically illustrating a state in which an insulating base material and a copper foil are laminated on the metal layer on which the electronic component is mounted.

First, as illustrated in FIG. 7, first and second insulating base materials 22 and 24 are prepared. The insulating base materials 22 and 24 are made of resin. Here, the insulating base materials 22 and 24 each are a sheet-like so-called prepreg obtained by impregnating a glass fiber with an uncured-state thermosetting resin. The first insulating base material 22 has a through-hole 30. The opening portion of the through-hole 30 is formed to have a size allowing the intra-substrate component 14 to be inserted thereinto and the height thereof (corresponding to the thickness of the insulating base material 22) is set higher than the height of the intra-substrate component 14. Meanwhile, as illustrated in FIG. 7, the second insulating base material 24 is of a flat plate shape without a through-hole.

Then, the first insulating base material 22 is laminated on the first metal layer 4, the second insulating base material 24 is placed on an upper side of the first insulating base material 22, and further a copper foil to serve as a second metal layer 28 is placed on an upper side of the second insulating base material 24 thereby to form a laminate. Here, the first insulating base material 22 is arranged so as to position the intra-substrate component 14 in the through-hole 30. Subsequently, so-called hot pressing for pressurizing and heating is performed on the entire laminate.

Figure 8:
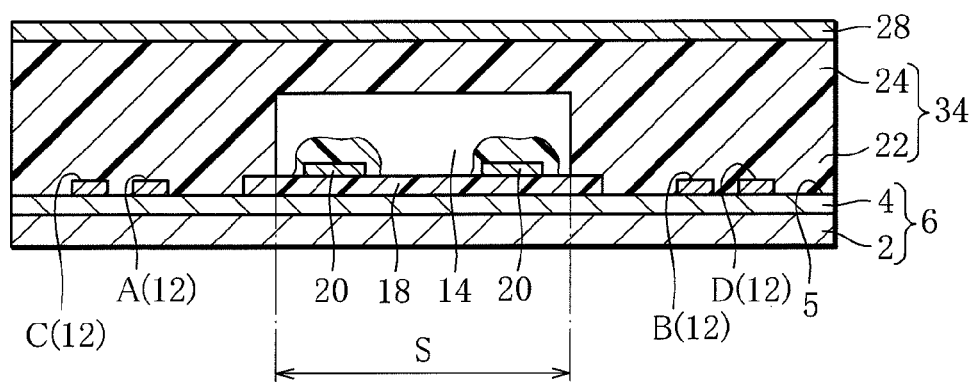
FIG. 8 is a cross-sectional view schematically illustrating a state in which the insulating base material and the copper foil are laminated and integrated on the metal layer on which the electronic component is mounted.

Thereby, the uncured-state thermosetting resin of the prepreg is pressurized and filled in a gap of the through-hole 30 and the like and then is cured by the heat of the hot pressing. As a result, as illustrated in FIG. 8, an insulating substrate (buried layer) 34 including the insulating base materials 22 and 24 is formed and the intra-substrate component 14 is buried in the insulating substrate 34. Here, the through-hole 30 is preliminarily provided in the insulating base material 22, which can avoid the pressure applied to the intra-substrate component 14 during hot pressing. Therefore, even a large-sized intra-substrate component 14 can be buried in the insulating substrate without damage.

Figure 9:
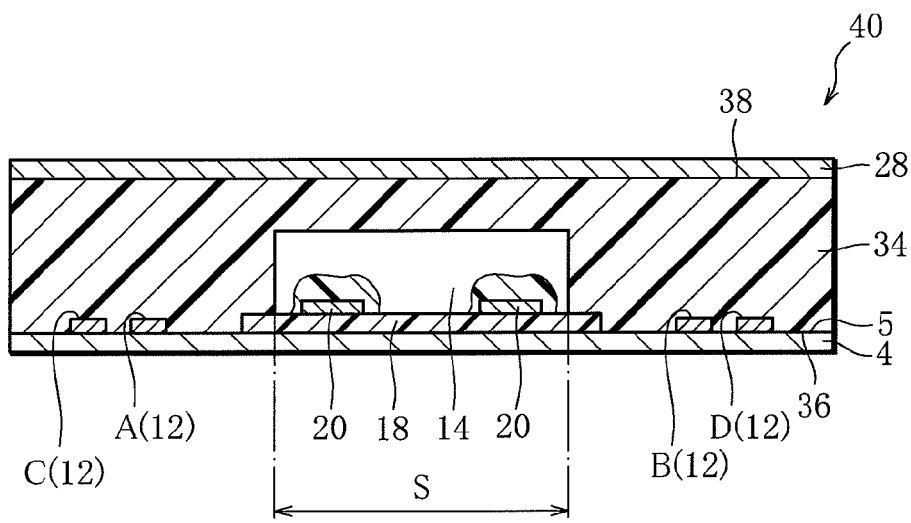
FIG. 9 is a cross-sectional view schematically illustrating a state in which the support plate is removed from the metal layer.

Then, as illustrated in FIG. 9, the support plate 2 is removed. Thus, an intermediate 40 of the component-embedded substrate is obtained. The intermediate 40 includes an insulating substrate 34 having an intra-substrate component 14 therein; a first metal layer 4 formed on one surface (lower surface) 36 of the insulating substrate 34; and a second metal layer 28 formed on the other surface (upper surface) 38 thereof. Here, the first surface 3 of the first metal layer 4 is exposed by separation of the support plate 2.

Next, windows are formed in the obtained intermediate 40 by removing a predetermined portion of the first metal layer 4 (window forming step).

Figure 10:
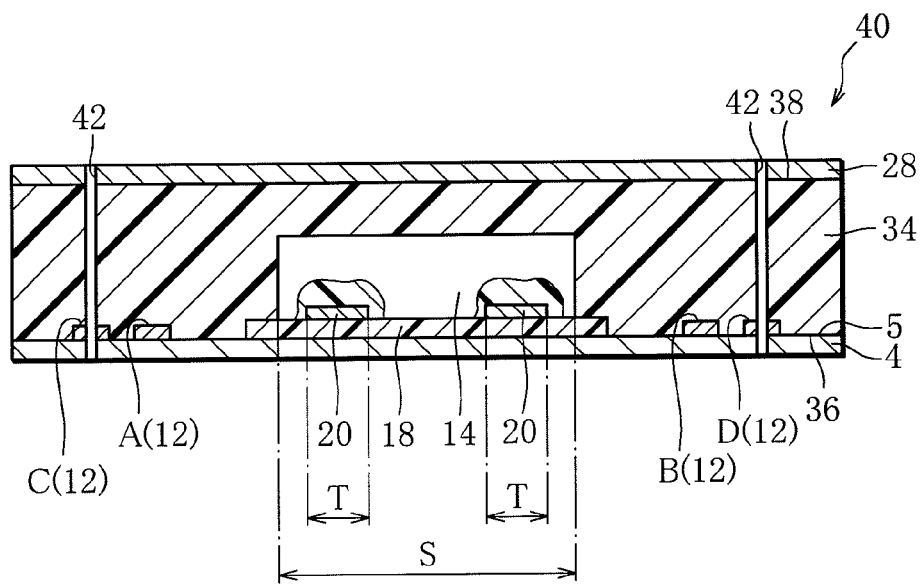
FIG. 10 is a cross-sectional view schematically illustrating an intermediate that has been subjected to an X-ray drilling process.

First, as illustrated in FIG. 10, the positions of the outside marks C and D are detected and a drill is used to form reference holes 42 and 42 each penetrating all of the metal layers 4 and 28, the insulating substrate 34, and the outside marks C and D. Here, the positions of the outside marks C and D are detected by an X-ray irradiation apparatus (unillustrated) for use in a common X-ray drilling process.

Figure 11:
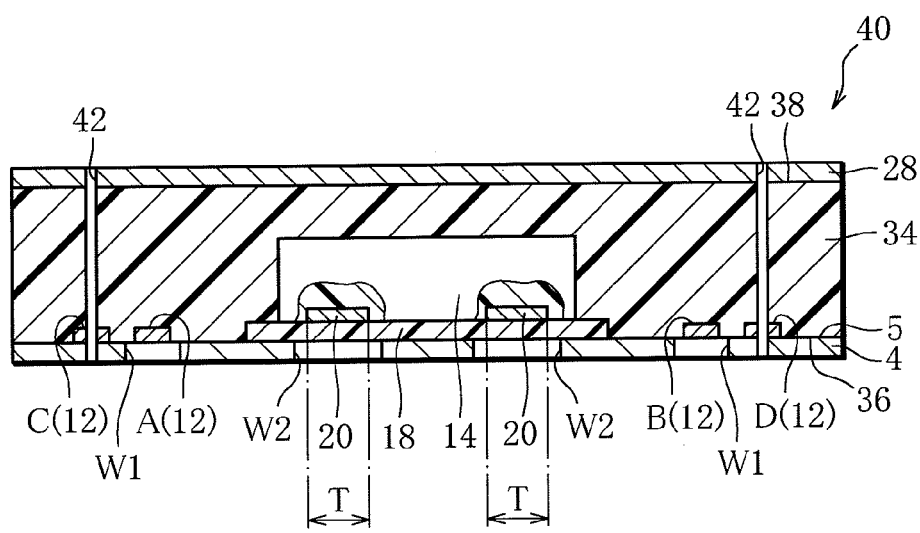
FIG. 11 is a cross-sectional view schematically illustrating the intermediate of FIG. 10 with windows formed therein.

Subsequently, the reference holes 42 are used as the references to determine the inside marks A and B and a portion in which the terminals 20 of the intra-substrate component 14 are located (hereinafter referred to as a terminal location portion T). Then, for each determined portion, part of the first metal layer is removed from the first surface 3 of the first metal layer 4 by a commonly used etching process. This forms the inside marks A and B; a first window W1 for exposing part of the insulating substrate 34; and a second window W2 for exposing a portion of the adhesive layer 18 including the terminal location portion T. At this time, as illustrated in FIG. 11, the windows W1 and W2 each are formed slightly larger than the inside marks A and B and terminals 20 and 20 respectively.

Next, a via hole is formed in the adhesive layer 18 of the terminal location portion T (via hole forming step).

Figure 12:
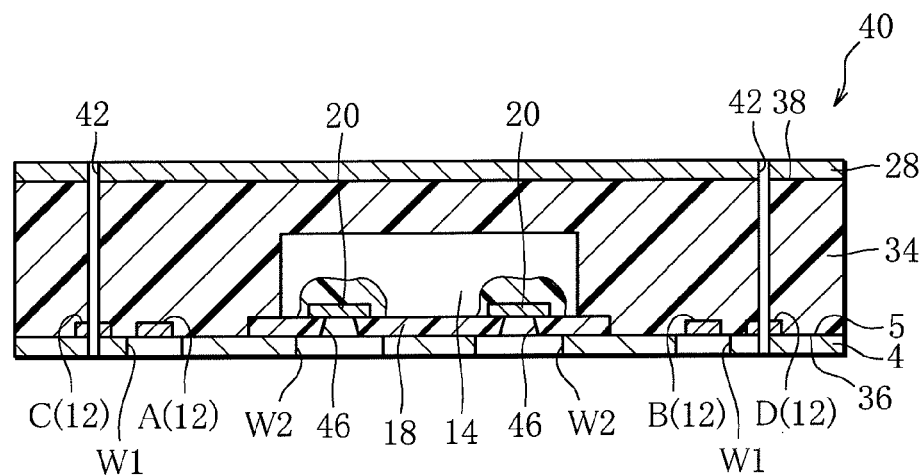
FIG. 12 is a cross-sectional view schematically illustrating the intermediate of FIG. 11 with laser via holes formed therein.

First, the exposed inside marks A and B are recognized by an optical sensor of an optical positioning apparatus (unillustrated). Then, the position of the terminal 20 of the intra-substrate component 14 hidden in the adhesive layer 18 is determined using the inside marks A and B as the references. Subsequently, the determined terminal position of the adhesive layer 18 is irradiated with laser such as carbon dioxide laser to remove the adhesive layer 18 and thereby to form a first laser via hole (hereinafter referred to as a first LVH) 46 reaching the terminal 20 as illustrated in FIG. 12. Thus, the terminal 20 of the intra-substrate component 14 is exposed. Here, the windows W1 and W2 are formed slightly larger than the inside marks A and B and the terminals 20 and 20 respectively. Accordingly, the entire inside marks A and B can be recognized through the first window W1 and the target location can be effectively irradiated with laser through the second window W2 without being reflected by the first metal layer 4.

As clear from the above described embodiment, the present invention is characterized in that the inside marks A and B are used not only to position the intra-substrate component 14 but also to form the first LVH 46 again. In other words, the present invention commonly uses the marks not only to position the intra-substrate component 14 but also to position the first LVH 46, which can exhibit an extremely high accuracy of positioning and hence can form the first LVH 46 at an accurate position relative to the terminal 20 hidden in the adhesive layer 18.

Next, the intermediate 40 having the first LVH 46 therein is subjected to a desmear process to remove a resin residue therefrom, and then to a plating process to deposit copper on the surface of the intermediate 40 and to fill copper into the first LVH 46. This forms a conductive via for electrically connecting the terminal 20 of the intra-substrate component 14 to the first metal layer 4 (conductive via forming step).

Figure 13:
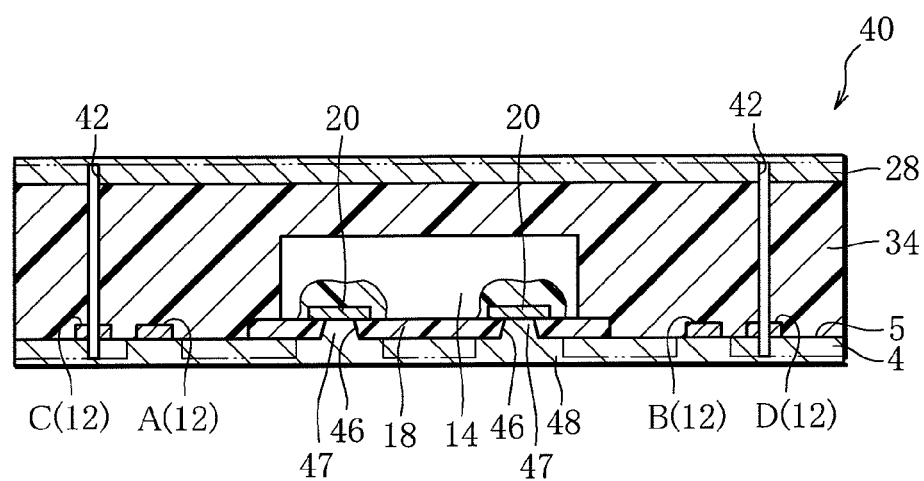
FIG. 13 is a cross-sectional view schematically illustrating the intermediate of FIG. 12 that has been subjected to a plating process.

First, the interior of the first LVH 46 is subjected to a copper electroless plating process to cover the inner wall surface of the first LVH 46 and the surface of the terminal 20 of the intra-substrate component 14 with copper. Subsequently, a copper electroplating process is performed to grow a copper plating layer 48 covering the entire first metal layer 4 including the inside of the first LVH 46 as illustrated in FIG. 13. Thus, the inside of the first LVH 46 is filled with copper to form a first conductive via 47. The first conductive via 47 is integrated into the first metal layer 4 so that the terminal 20 of the intra-substrate component 14 is electrically connected to the first metal layer 4.

Next, parts of the first metal layer 4 and the second metal layer 28 on the surface of the insulating substrate 34 are removed to form a predetermined wiring pattern 50 (pattern forming step).

Figure 14:
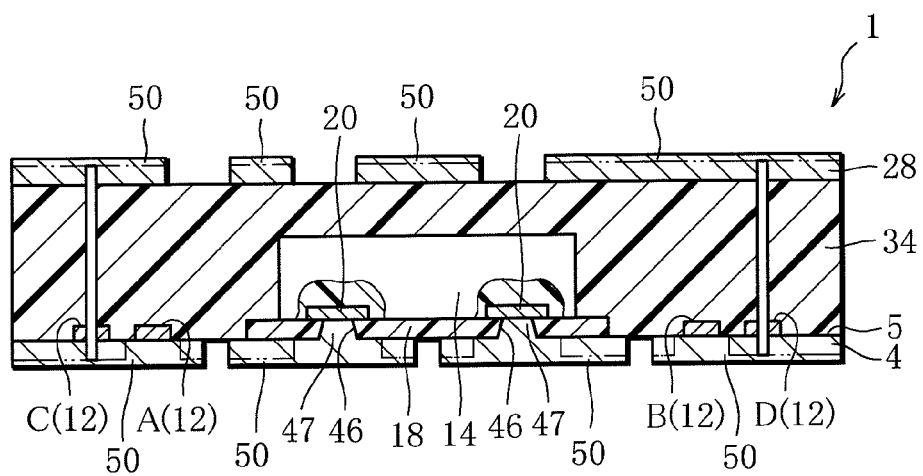
FIG. 14 is a cross-sectional view schematically illustrating the component-embedded substrate according to the first embodiment of the present invention.

The parts of both metal layers 4 and 28 are removed by a common etching process. This forms a component-embedded substrate 1 incorporating the intra-substrate component 14 having the terminal 20 electrically connected to the wiring pattern 50 in the insulating substrate 34 having the predetermined wiring pattern 50 on the surface thereof as illustrated in FIG. 14.

The present invention does not preliminarily drill a hole for filling the mounting expected region S with metal and hence prevents the adhesive from falling down thereinto. Therefore, various adhesives including low viscosity liquid-state adhesives can be used.

With other electronic components mounted on the surface thereof, thus obtained component-embedded substrate 1 can be used as a module board. In addition, the component-embedded substrate 1 can also be used as a core board to form a multilayer circuit board by a commonly used buildup method.

Note that the first embodiment is such that in the window forming step, both of the first window and the second window are formed, but the present invention is not limited to this embodiment and another embodiment may be such that in the window forming step, only the first window is formed. In this case, the position of the terminal of the component is determined using the main marks (inside marks) exposed from the first windows as the references, and then, for example, a copper direct method is used to remove the adhesive layer including the metal layer to form a via hole.

(Second Embodiment)

The second embodiment is different from the first embodiment only in that the mark forming step of the first embodiment further includes forming a pedestal 60 for placing the intra-substrate component 14. Thus, the following description of the second embodiment omits the detailed description of the same steps as those which have already been described. It should be noted that the same reference characters or numerals are assigned to the same components and portions which exhibit the same function as those which have already been described, and the description is omitted.

Figure 15:
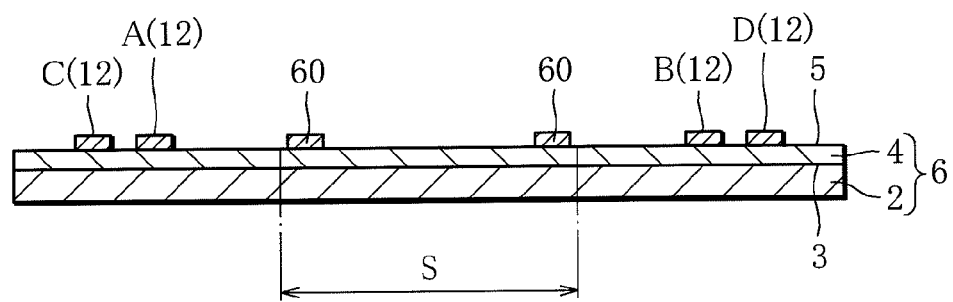
FIG. 15 is a cross-sectional view schematically illustrating a state in which marks and pedestals are formed on a metal layer on a support plate for use in a component-embedded substrate manufacturing method according to a second embodiment of the present invention.

The mark forming step of the second embodiment forms not only an opening for positioning mark in a dry film serving as the mask layer 8 to be formed on the first metal layer 4 but also an opening for the pedestal 60 at a predetermined position in the mounting expected region S in which the intra-substrate component 14 is to be mounted. Then, the copper-clad steel plate 6 having such a mask layer 8 is subjected to copper electroplating. Thus, the inside marks A and B, the outside marks C and D, and the pedestals 60 and 60, each made of a copper columnar body, are simultaneously formed (see FIG. 15). Here, the height of the pedestal 60 is set to the same size as the thickness of the adhesive layer 18 expected to be formed in a later step. Here, the pedestals 60 are formed within the mounting expected region S and at a position not overlapping with the terminals 20 of the intra-substrate component 14 to be mounted thereon.

Figure 16:
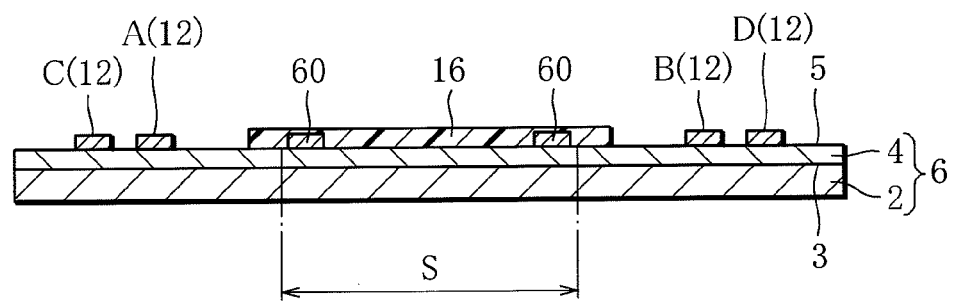
FIG. 16 is a cross-sectional view schematically illustrating a state in which an adhesive is supplied onto the metal layer of FIG. 15.

Next, the component mounting step of the second embodiment supplies the adhesive 16 in the mounting expected region S on the second surface 5 of the first metal layer 4. At this time, the adhesive 16 to be supplied is preferably a liquid-state adhesive, and as illustrated in FIG. 16, the adhesive 16 is applied to a thickness just enough to slightly cover the pedestal 60 and to cover the entire mounting expected region S.

Figure 17:
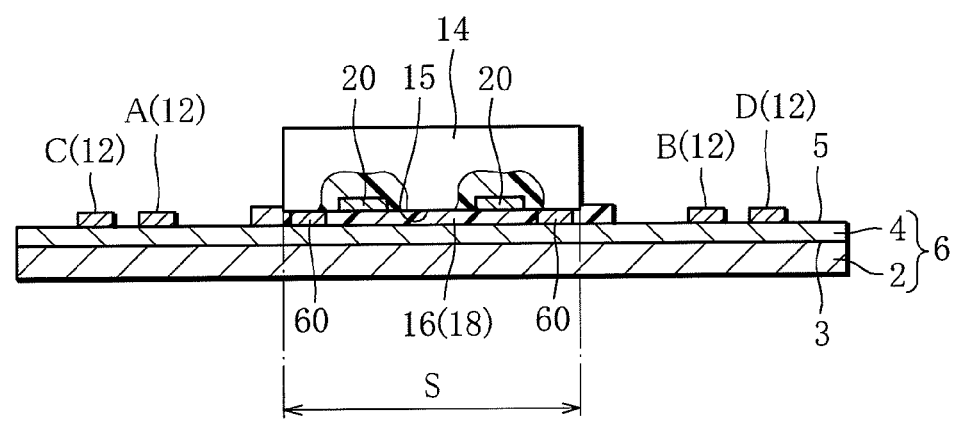
FIG. 17 is a cross-sectional view schematically illustrating a state in which an electronic component is placed on the pedestals of FIG. 16.

Subsequently, the intra-substrate component 14 is mounted at a predetermined position of the mounting expected region S (see FIG. 17). At this time, the intra-substrate component 14 sinks partially in the adhesive 16 due to its own weight and the lower surface 15 thereof abuts the upper end portion of the pedestal 60. This secures a predetermined thickness of space between the second surface 5 of the first metal layer 4 and the lower surface 15 of the intra-substrate component 14 and the adhesive layer 18 is formed in the space. Thus, the thickness of the adhesive layer 18 is the thickness as designed, thus securing required adhesive strength and insulating properties.

Figure 18:
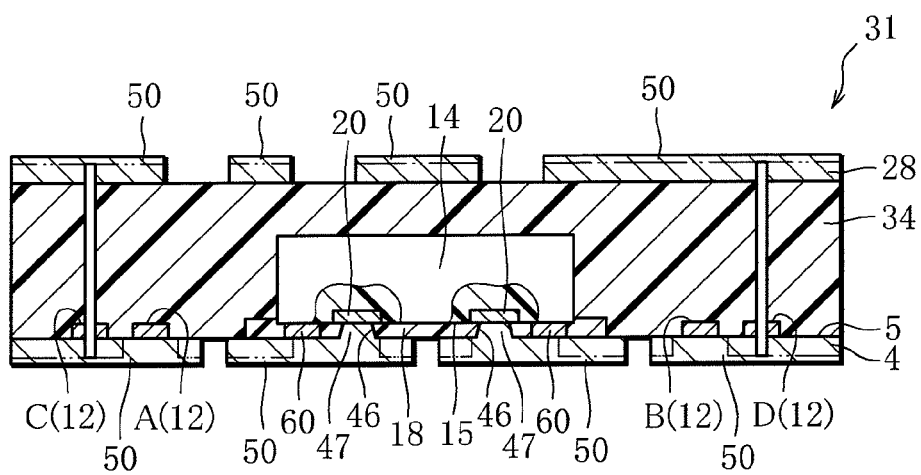
FIG. 18 is a cross-sectional view schematically illustrating a component-embedded substrate according to the second embodiment of the present invention.

Then, in the same manner as in the first embodiment, the component mounting step is followed by the buried layer forming step, the window forming step, the via hole forming step, the conductive via forming step, and the pattern forming step to obtain the component-embedded substrate 31 as illustrated in FIG. 18. More particularly, the component-embedded substrate 31 includes an insulating substrate 34 having a predetermined wiring pattern 50 on the surface thereof; and an intra-substrate component 14 embedded in the insulating substrate 34, the intra-substrate component 14 having the terminals 20 electrically connected to the wiring pattern 50. The component-embedded substrate 31 includes pedestals 60 each made of a columnar copper post on the first metal layer 4 and the intra-substrate component 14 is placed on the pedestals 60. This prevents the size between the layer 4 from being shorter than the height of the pedestal 60, and hence the thickness of the adhesive layer 18 located therebetween is the thickness as designed.

(Third Embodiment)

The third embodiment is different from the first embodiment only in that a circuit board preparation step for preparing an inner circuit board 70 is added before the buried layer forming step and in the buried layer forming step, the inner circuit board 70 is further buried in a buried layer (insulating substrate 34). Thus, the following description of the third embodiment omits the detailed description of the same steps as those which have already been described. It should be noted that the same reference characters or numerals are assigned to the same components and portions which exhibit the same function as those which have already been described, and the description is omitted.

First, the inner circuit board 70 prepared in the circuit board preparation step is, for example, a two-layer circuit board in which inner conductive circuits 74 each having a predetermined pattern are formed on both surfaces of an inner insulating plate 72 serving as an insulating substrate. The inner circuit board 70 includes an inner via 76 which penetrates through the inner insulating plate 72 and electrically connects between the inner conductive circuits 74 located on both surfaces of the inner insulating plate 72; and alignment marks 78 provided at a predetermined position of the inner insulating plate 72.

The inner via 76 is a filled via formed by subjecting the inner via hole 80, which is formed in the inner insulating plate 72 by a laser process, to via filling plating to fill metal therein. Here, the inner via 76 can be formed by conformal plating. However, in terms of higher density of the circuit board, the filled via is more advantageous. Although it is desirable that in terms of higher density, the inner via hole 80 is formed by a laser process, but in terms of productivity and costs, the inner via hole 80 may be formed by a drill-through process.

Metal layers are formed on the surfaces of the inner insulating plate 72 by plating and the metal layers are processed into predetermined wiring patterns thereby to form the inner conductive circuits 74. At this time, the wiring patterns and the alignment marks 78 are formed at the same time. The alignment marks 78 each are provided at a predetermined position which allows the inner circuit board 70 to be arranged at the position as designed in the buried layer when it is aligned with the main marks (inside marks A and B).

Figure 19:
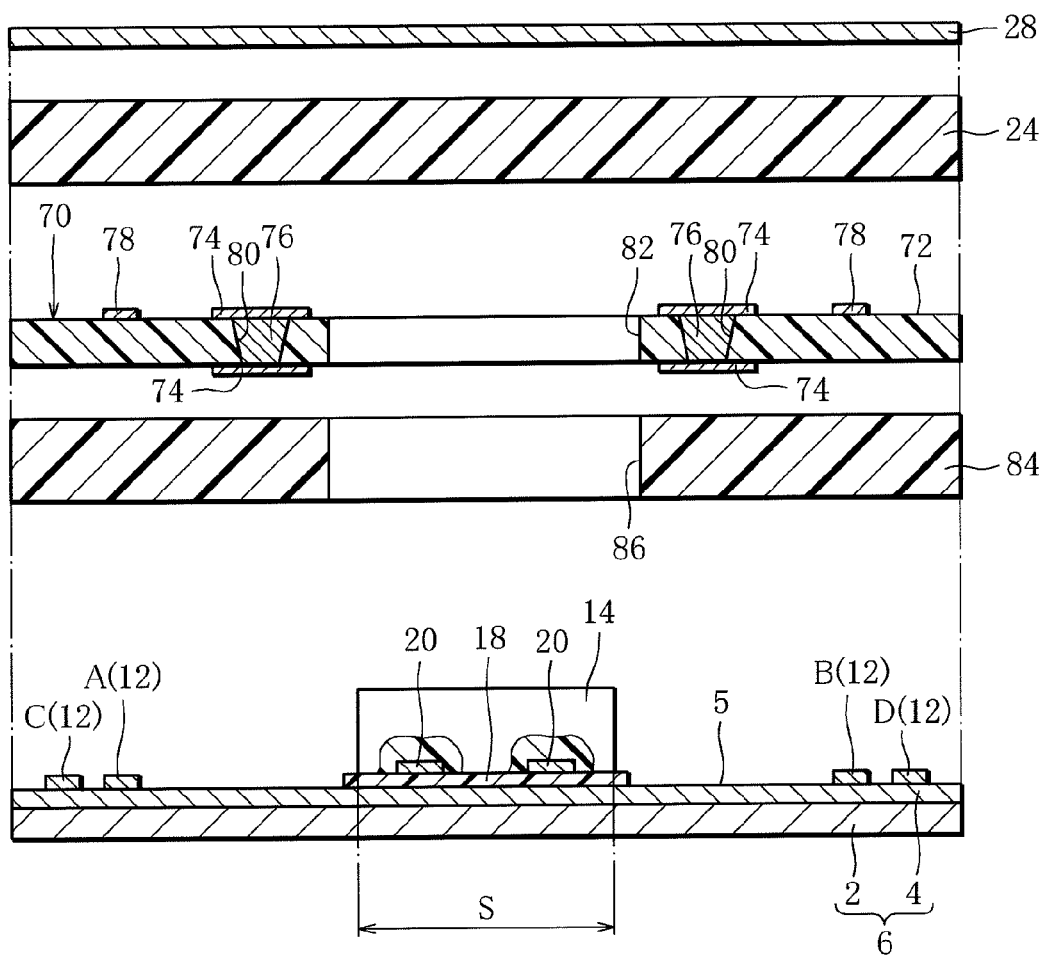
FIG. 19 is a cross-sectional view schematically illustrating a state in which an insulating base material, an inner circuit board, and a copper foil are laminated on the metal layer on which the electronic component is mounted.

Note that the inner circuit board 70 has a through-hole 82 as is clear from FIG. 19. The through-hole 82 is formed large enough to allow the intra-substrate component 14 to be inserted thereinto.

First, the buried layer forming step of the third embodiment prepares a third insulating base material 84 thinner than the first insulating base material 22 used in the first embodiment and the second insulating base material 24 used in the first embodiment. Here, the third insulating base material 84 has a through-hole 86 large enough to allow the intra-substrate component 14 to be inserted thereinto. The through-hole 86 is formed at a position continuing to the through-hole 82 of the inner circuit board 70 when the third insulating base material 84 and the inner circuit board 70 are laminated with each other. The thickness obtained by laminating the third insulating base material 84 and the inner circuit board 70 with each other is set to be larger than the height of the intra-substrate component 14.

Then, a lay-up process is performed by sequentially laminating the third insulating base material 84, the inner circuit board 70, the second insulating base material 24, and a copper foil to serve as the second metal layer 28 on the first metal layer 4. For the lay-up process, first, the inner circuit board 70 is held above the first metal layer 4. Then, the inside marks A and B on the first metal layer 4 and the alignment marks 78 on the inner circuit board are recognized by an optical sensor to position the inner circuit board 70 so that the inside marks A and B and the alignment marks 78 are aligned in the thickness direction of the component-embedded substrate. Subsequently, the inner circuit board 70 is moved toward the first metal layer 4 in a state in which the third insulating base material 84 is interposed between the first metal layer 4 and the inner circuit board 70, and then the inner circuit board 70 is placed on the first metal layer 4 with the third insulating base material 84 therebetween. Then, the second insulating base material 24 and the copper foil (28) are laminated on the inner circuit board 70 to obtain a laminate. Here, the intra-substrate component 14 is inserted in the through-hole 86 of the third insulating base material 84 and the through-hole 82 of the inner circuit board 70. Then, the entire laminate is subjected to hot pressing.

Figure 20:
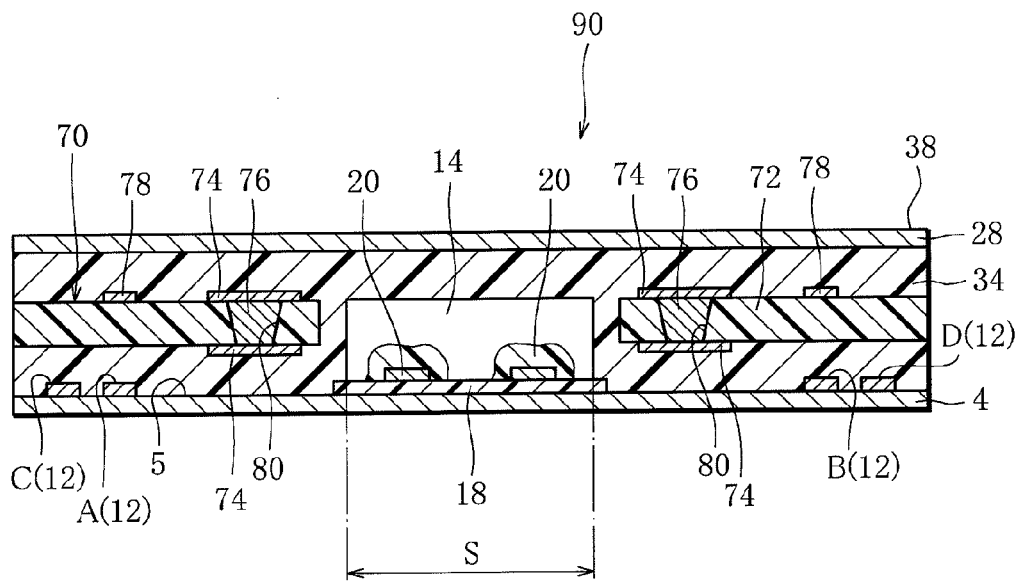
FIG. 20 is a cross-sectional view schematically illustrating a state in which the insulating base material, the inner circuit board, and the copper foil are laminated and integrated on the metal layer on which the electronic component is mounted.

After the hot pressing, as illustrated in FIG. 20, the support plate 2 is removed thereby to obtain an intermediate 90 in which the intra-substrate component 14 and the inner circuit board 70 as well as the inside marks A and B and the outside marks C and D are buried in the insulating substrate 34 (buried layer).

Figure 21:
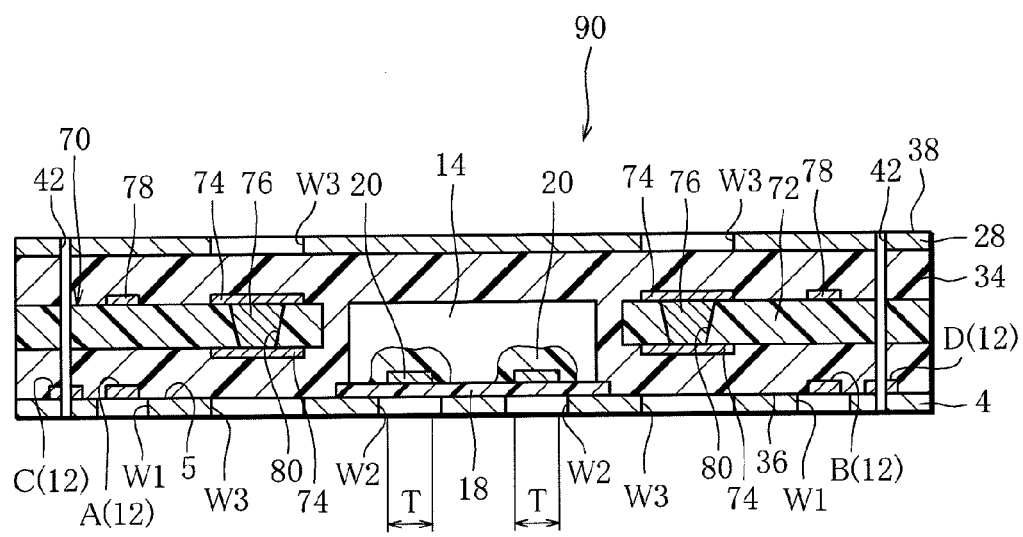
FIG. 21 is a cross-sectional view schematically illustrating an intermediate according to a third embodiment that has been subjected to an X-ray drilling process to form windows therein.

Next, third windows W3 as well as the first windows W1 and the second windows W2 are formed in the obtained intermediate 90, each third window W3 being formed at a predetermined position of the inner conductive circuit 74, for example, at a position corresponding to a portion where the inner via 76 is located. As is clear from FIG. 21, the third windows W3 are formed on both of the first metal layer 4 and the second metal layer 28. The third windows W3 can be formed using the reference holes 42 as the references simultaneously together with the first windows W1, but the present invention is not limited to this embodiment. For example, after the first windows W1 are formed, the third windows W3 may be formed using the inside marks A and B exposed from the first windows W1 as the references.

Next, a via hole is formed in a buried layer of a portion exposed from the third window W3.

Figure 22:
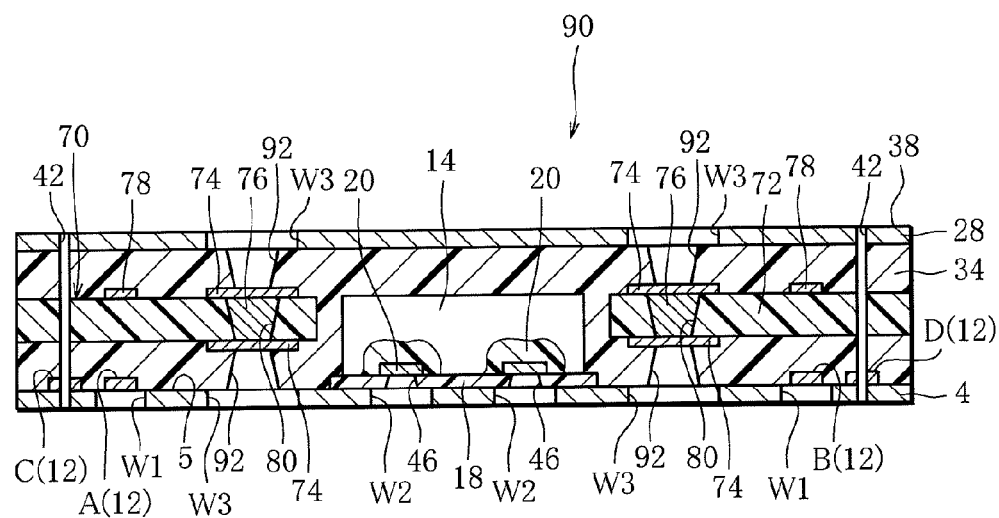
FIG. 22 is a cross-sectional view schematically illustrating the intermediate of FIG. 21 with a laser via hole formed therein.

First, the exposed inside marks A and B are recognized by an optical sensor of an optical positioning apparatus (unillustrated). Then, the positions of the inside marks A and B are used as the references to determine a predetermined position of the inner conductive circuit 74 of the inner circuit board 70 hidden in the buried layer, for example, a position in which the inner via 76 is located. Subsequently, the buried layer at a portion corresponding to the predetermined position of the determined inner conductive circuit 74 is irradiated with laser such as carbon dioxide laser to remove the buried layer and thereby to form a second laser via hole (hereinafter referred to as a second LVH) 92 reaching the inner conductive circuit 74 as illustrated in FIG. 22. This exposes the predetermined position of the inner conductive circuit 74.

Figure 23:
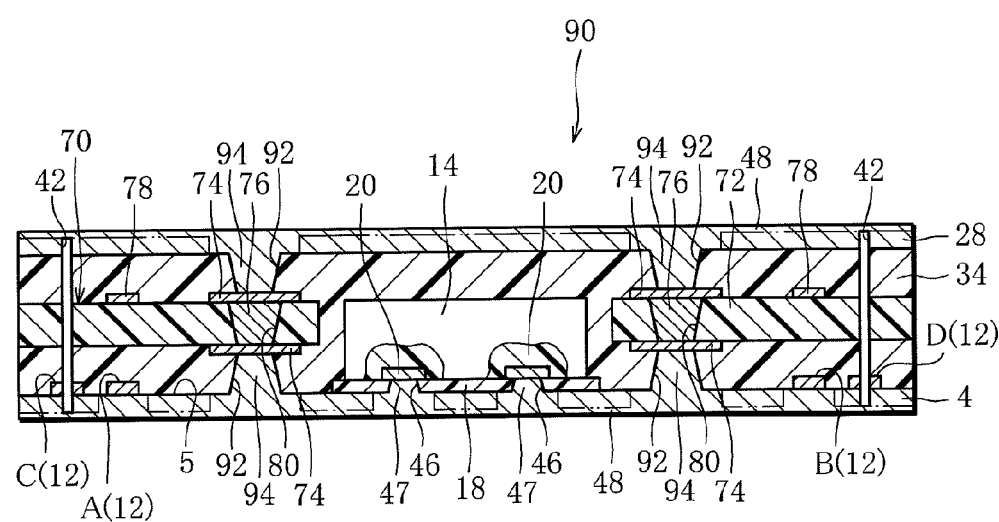
FIG. 23 is a cross-sectional view schematically illustrating the intermediate of FIG. 22 that has been subjected to a plating process.

Next, the intermediate 90 having the first LVH 46 and the second LVH 92 is subjected to a desmear process to remove the resin residue. Then, the intermediate 90 is subjected to a via filling plating process to deposit copper on the surface thereof and fill the first LVH 46 and the second LVH 92 with copper. This forms a first conductive via 47 electrically connecting the terminal 20 of the intra-substrate component 14 and the first metal layer 4; and a second conductive via 94 electrically connecting the inner conductive circuit 74 of the inner circuit board 70 and the first metal layer 4 and the second metal layer 28 (see FIG. 23).

Subsequently, parts of the first metal layer 4 of the surface of the insulating substrate 34 and the second metal layer 28 are removed to form a predetermined wiring pattern 50.

Figure 24:
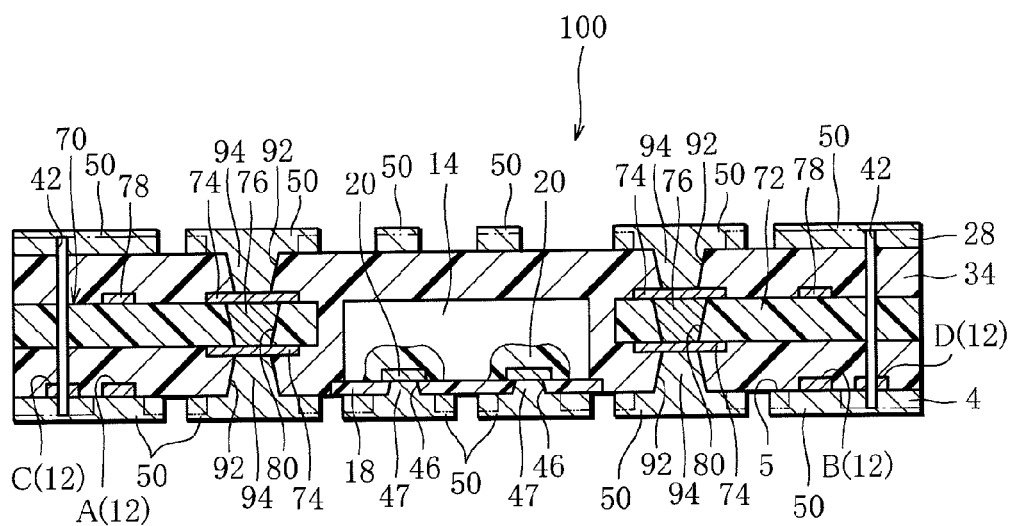
FIG. 24 is a cross-sectional view schematically illustrating a component-embedded substrate according to the third embodiment of the present invention.

This provides a component-embedded substrate 100 in which the inner circuit board 70 is buried in the insulating substrate 34 (buried layer) as illustrated in FIG. 24.

The component-embedded substrate 100 of the third embodiment is a so-called any layer structure because inter-layer electrical connection is made all through a filled via. The any layer structure has a high degree of freedom in design and is effective for higher density circuit board since the conductive via is filled with metal and the wiring pattern can be formed thereon.

As is clear from FIG. 24, in the component-embedded substrate 100, the second conductive via 94 is formed to have a larger diameter than the first conductive via 47. In this case, the insulating base materials 84 and 24 are assumed to have a thickness equal to or greater than that of the adhesive layer 18 so as to be thick enough to bury the component. Therefore, the depth of the second conductive via 94 may be equal to or greater than the depth of the first conductive via 47. In terms of plating steps, the via diameter of the second conductive via 94 is set equal to or greater than that of the first conductive via 47, which provides advantages capable of preventing deterioration of plating solution circulation and securing plating quality on conductive via. Note that the diameter of the second conductive via 94 may be set the same as that of the first conductive via 47.

Figure 25:
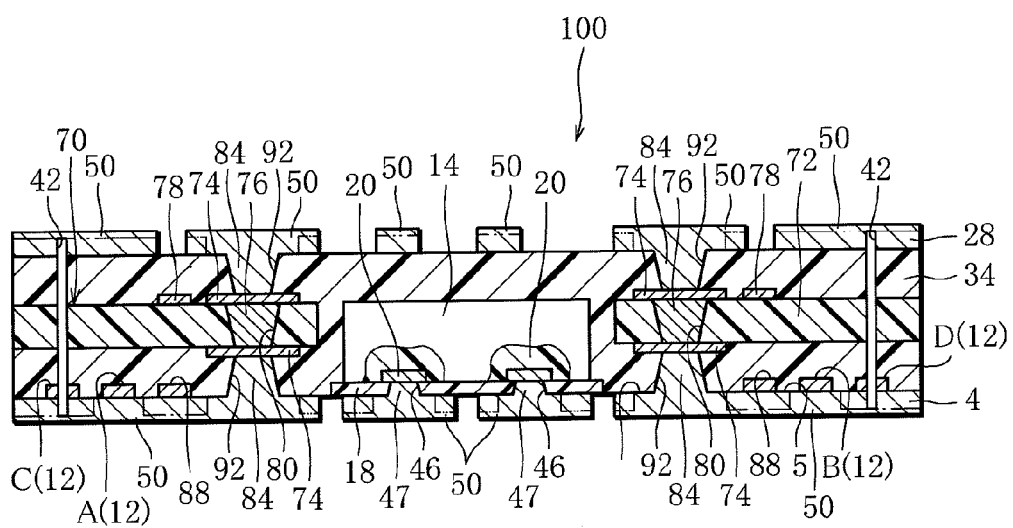
FIG. 25 is a cross-sectional view illustrating an aspect in which reference marks are formed on the component-embedded substrate according to the third embodiment.

Here, the third embodiment can further form reference marks 88 for positioning the inner circuit board 70 in a predetermined position of the first metal layer 4 together with the inside marks A and B and the outside marks C and D (see FIG. 25). The reference marks 88 are formed with the same accuracy as that of the main marks (inside marks A and B). Meanwhile, the alignment marks 78 of the inner circuit board 70 are also provided at a predetermined position corresponding to the reference marks 88. Thus, during the lay-up process, the reference marks 88 are aligned with the alignment marks 78 of the inner circuit board 70, and thereby the inner circuit board 70 can be positioned at the predetermined position as designed. Such an embodiment of providing the reference marks 88 separately from the main marks provides the following advantages. For example, there is a case in which even if the above described lay-up process requires the main marks to be positioned at a position difficult to be recognized by the optical sensor, the reference marks 88 can be provided at a position easy to be recognized by the optical sensor. In such a case, the inner circuit board 70 can be positioned easily with a good accuracy using the reference marks 88.

Note that the above described embodiments use both of the inside mark A and the inside mark B as the marks for positioning the intra-substrate component 14 and the LVH, but the present invention is not limited to these embodiments. For example, another embodiment may use only one of the inside mark A and the inside mark B as the marks for positioning the intra-substrate component 14 and the LVH. The present invention is characterized by using the same mark for the terminal positioning when the intra-substrate component is positioned and the LVH is provided, and hence even the use of only one of the inside mark A and the inside mark B can exert sufficiently high positioning accuracy. The above description has focused on embodiments using both of the inside mark A and the inside mark B as preferred embodiments of more improving the positioning accuracy.

Note that the present invention is not limited to the embodiments of providing the main marks near the mounting expected region S, but the main marks may be provided at a portion far away from the mounting expected region S. For example, in a case in which a plurality of component-embedded substrates are made in a large-size workpiece and then an individual component-embedded substrate is cut out from the workpiece, the main mark can be formed in a frame portion of the workpiece.

Note also that according to the present invention, the component to be embedded in the insulating substrate is not limited to the packaging component, but other various electronic components including chip components may be used.

EXPLANATION OF REFERENCE CHARACTERS 1,31 component-embedded substrate
2 support plate
3 first surface
4 first metal layer
5 second surface
6 copper-clad steel plate
8 mask layer
12 positioning mark
14 electronic component (intra-substrate component)
16 adhesive
18 adhesive layer
20 terminal
34 insulating substrate
40 intermediate
46 laser via hole (LVH)
47 first conductive via
50 wiring pattern
60 pedestal
70 inner circuit board
72 inner insulating plate
74 inner conductive circuit
76 inner via
78 alignment mark
80 inner via hole
94 second conductive via
100 component-embedded substrate
S mounting expected region

The invention claimed is:

1. A component-embedded substrate manufacturing method of manufacturing a component-embedded substrate where in an insulating substrate having a wiring pattern on a surface thereof, an electrical or electronic component having a terminal electrically connected to the wiring pattern is embedded, the method comprising:
   a mark forming step of forming a metal layer to serve as the wiring pattern on a support plate and forming a main mark made of a metal columnar body on a second surface opposite to a first surface contacting the support plate of the metal layer;
   a component mounting step of positioning the component using the main mark as a reference relative to the metal layer and mounting the component on the second surface of the metal layer with an insulating adhesive layer interposed between the second surface and each of the component and the terminal;
   a buried layer forming step of forming a buried layer serving as the insulating substrate having the component and the main mark buried on the second surface of the metal layer having the component mounted thereon;
   a window forming step of separating the support plate from the metal layer, then removing part of the metal layer from the first surface side of the metal layer exposed by the separation, to form a first window for exposing the main mark and at least a part of the buried layer;
   a via hole forming step of determining a position of a terminal of the component using the main mark exposed from the first window as a reference and forming a first via hole reaching the terminal;
   a conductive via forming step of subjecting the first via hole to a plating process, then filling metal into the first via hole to form a first conductive via; and
   a pattern forming step of forming the wiring pattern from the metal layer electrically connected to the terminal through the conductive via.

2. The component-embedded substrate manufacturing method according to claim 1, wherein in the mark forming step, a sub mark made of a metal columnar body is formed on the second surface of the metal layer simultaneously together with the main mark;
   before the window forming step, the method further comprises a through-hole forming step of determining the sub mark using X-rays to form a through-hole penetrating all of the metal layer, the sub mark, and the buried layer, wherein in the window forming step, the first window is formed using the through-hole as a reference.

3. The component-embedded substrate manufacturing method according to claim 1, wherein in the window forming step, a second window for exposing a portion of the adhesive layer including a position corresponding to the terminal of the component is further formed; and in the via hole forming step, the first via hole reaching the terminal in the adhesive layer exposed from the second window is formed.

4. The component-embedded substrate manufacturing method according to claim 3, wherein in the mark forming step, a sub mark made of a metal columnar body is formed on the second surface of the metal layer simultaneously together with the main mark;
   before the window forming step, the method further comprises a through-hole forming step of determining the sub mark using X-rays and thereby forming a through-hole penetrating all of the metal layer, the sub mark, and the buried layer, wherein in the window forming step, the first window and the second window are formed using the through-hole as a reference.

5. The component-embedded substrate manufacturing method according to claim 1, wherein in the mark forming step, a pedestal made of a metal columnar body is formed simultaneously together with the main mark at a position within a mounting expected region of the component on the second surface of the metal layer and at a position excluding a portion in which the terminal is expected to be positioned; and
   in the component mounting step, the component on the pedestal is placed and the adhesive layer is interposed between the second surface and both of the component and the terminal.

6. The component-embedded substrate manufacturing method according to claim 1, before the buried layer forming step, the method further comprising a circuit board preparation step of preparing an inner circuit board to be further buried within the buried layer, the inner circuit board including an inner insulating plate, an inner conductive circuit provided on both surfaces of the inner insulating plate, and an alignment mark provided at a predetermined position on the inner insulating plate, wherein
   in the buried layer forming step, the buried layer is formed in a state in which the alignment mark and the main mark are aligned in a thickness direction of the component-embedded substrate and a predetermined space is secured between the inner circuit board and the second surface of the metal layer;

in the via hole forming step, a position of the inner conductive circuit is determined using the main mark exposed from the first window as a reference and a second via hole reaching the inner conductive circuit is further formed; and in the conductive via forming step, the second via hole is plated with metal and a second conductive via is further formed.

7. The component-embedded substrate manufacturing method according to claim 6, wherein in the conductive via forming step, the second conductive via is a filled via obtained by subjecting the second via hole to via filling plating and filling metal therein.

8. The component-embedded substrate manufacturing method according to claim 6, wherein in the conductive via forming step, the second conductive via is formed to have a diameter equal to or greater than that of the first conductive via.

9. The component-embedded substrate manufacturing method according to claim 1, wherein the columnar body is formed by pattern plating using a plating resist film.

10. The component-embedded substrate manufacturing method according to claim 1, wherein the adhesive layer is made of an epoxy-based resin or a polyimide-based resin.

11. The component-embedded substrate manufacturing method according to claim 1, wherein in the component mounting step, the component is mounted in a state in which the terminal of the component is oriented toward the second surface side.

12. The component-embedded substrate manufacturing method according to claim 1, wherein an aluminum plate is used as the support plate; and a copper foil attached to the aluminum plate is used as the metal layer.

13. The component-embedded substrate manufacturing method according to claim 1, wherein a stainless plate is used as the support plate; and a copper plating film deposited on the stainless plate is used as the metal layer.

* * * * *